US012641982B2

(12) United States Patent　　(10) Patent No.:　US 12,641,982 B2
　　　Kimura　　　　　　　　　　　　(45) Date of Patent:　　May 26, 2026

(54) DISPLAY DEVICE

(71) Applicant: Magnolia White Corporation, Tokyo (JP)

(72) Inventor: Hiroyuki Kimura, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 468 days.

(21) Appl. No.: 18/363,748

(22) Filed: Aug. 2, 2023

(65) Prior Publication Data

US 2024/0049561 A1　　Feb. 8, 2024

(30) Foreign Application Priority Data

Aug. 3, 2022　　(JP) ................................. 2022-124038

(51) Int. Cl.
　　*H10K 59/80*　　　(2023.01)
　　*H10K 59/122*　　 (2023.01)
(52) U.S. Cl.
　　CPC ..... *H10K 59/80515* (2023.02); *H10K 59/122* (2023.02); *H10K 59/80521* (2023.02)
(58) Field of Classification Search
　　CPC .. H10K 59/17; H10K 59/1795; H10K 59/179; H10K 59/80521; H10K 59/80515; H10K 59/122
　　See application file for complete search history.

(56) References Cited

U.S. PATENT DOCUMENTS

2004/0160170 A1　　8/2004　Sato et al.
2004/0160176 A1 *　8/2004　Kim ...................... H05B 33/10
　　　　　　　　　　　　　　　　　　313/506

2009/0009069 A1　　1/2009　Takata
2013/0032841 A1 *　2/2013　Jinbo ..................... H10K 50/19
　　　　　　　　　　　　　　　　　　257/E33.072
2019/0363275 A1　　11/2019　Ochi et al.
2020/0303469 A1　　9/2020　Lee
2022/0077251 A1　　3/2022　Choung et al.
2022/0077434 A1　　3/2022　Seo et al.

(Continued)

FOREIGN PATENT DOCUMENTS

JP　　2000-195677 A　　7/2000
JP　　2004-207217 A　　7/2004
JP　　2008-135325 A　　6/2008

(Continued)

OTHER PUBLICATIONS

Office Action issued on Apr. 10, 2026, in corresponding German patent Application No. 10 2023 207 390.0, 23 pages.

*Primary Examiner* — Mariceli Santiago
(74) *Attorney, Agent, or Firm* — XSENSUS LLP

(57)　　　　　　ABSTRACT

According to one embodiment, a display device includes a substrate, a conductive layer provided over a display area and extending to outside of the display area above the substrate, a plurality of lower electrodes provided in matrix in the display area above the conductive layer, a rib formed of an inorganic insulating material and including a plurality of apertures overlapping the lower electrodes, respectively, an organic layer provided on the lower electrodes in the apertures, and an upper electrode which is provided on the organic layer, is formed in a belt-like shape and is in contact with the conductive layer in both end portions located outside the display area.

22 Claims, 7 Drawing Sheets

(56)         References Cited

U.S. PATENT DOCUMENTS

| | | |
|---|---|---|
| 2022/0102670 A1* | 3/2022 | Peng ............... H10K 59/80521 |
| 2022/0157913 A1 | 5/2022 | Choi et al. |

FOREIGN PATENT DOCUMENTS

| | | | |
|---|---|---|---|
| JP | 2009-32673 A | | 2/2009 |
| JP | 2010-118191 A | | 5/2010 |
| JP | 2018-060600 A | | 4/2018 |
| JP | 2021082614 A | * | 5/2021 |
| WO | 2018/179308 A1 | | 10/2018 |
| WO | 2020/206721 A1 | | 10/2020 |

* cited by examiner

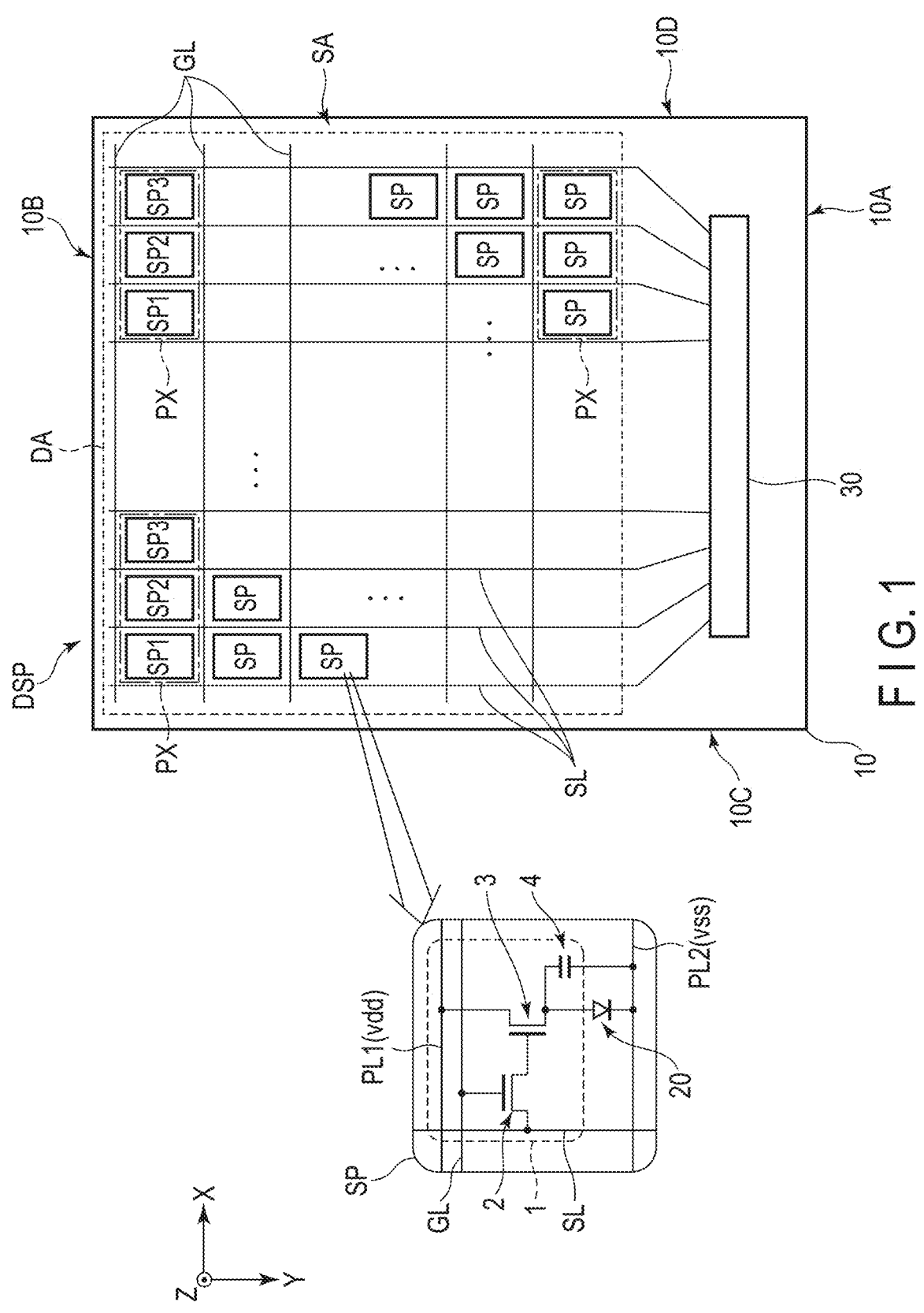
F I G. 1

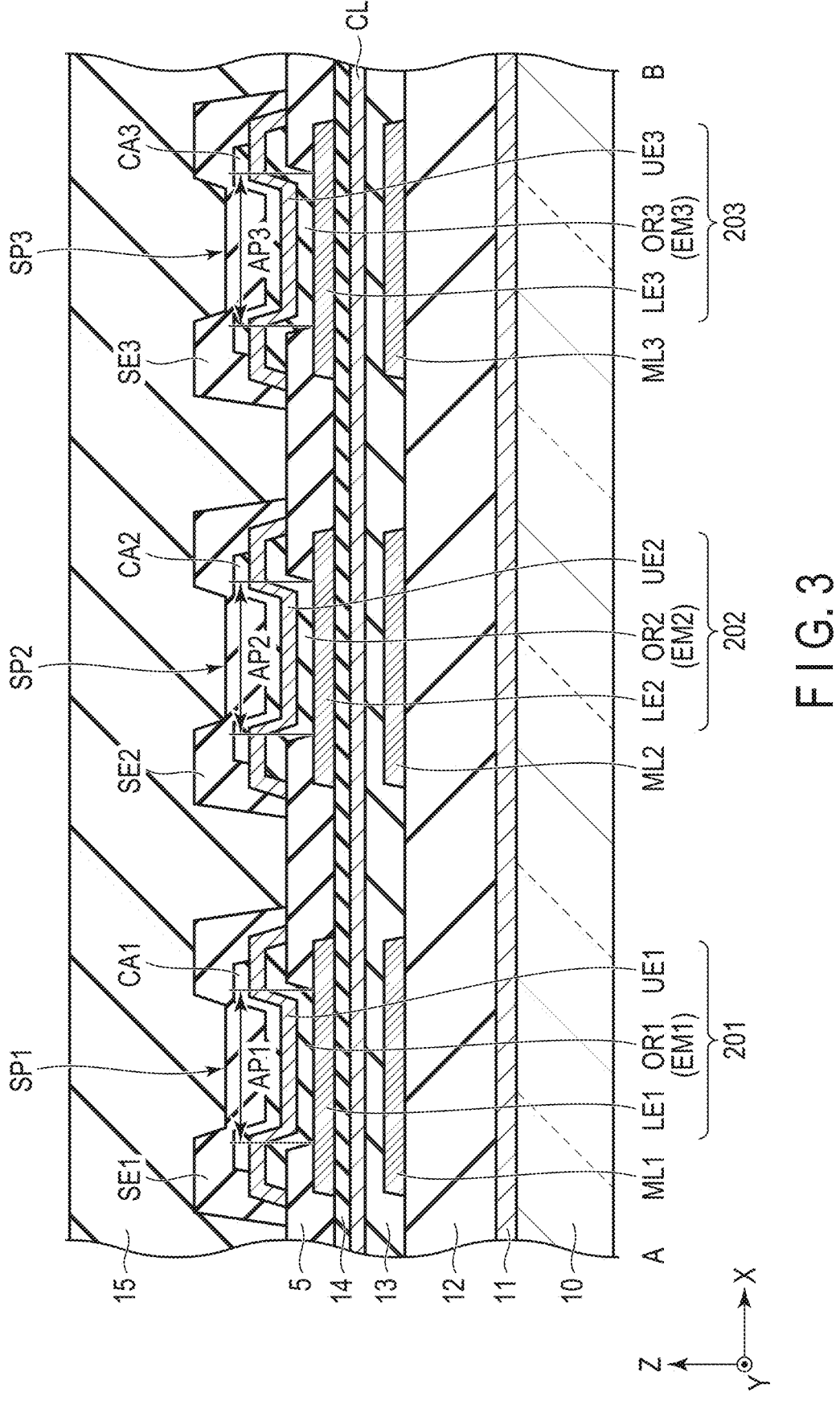
F I G. 3

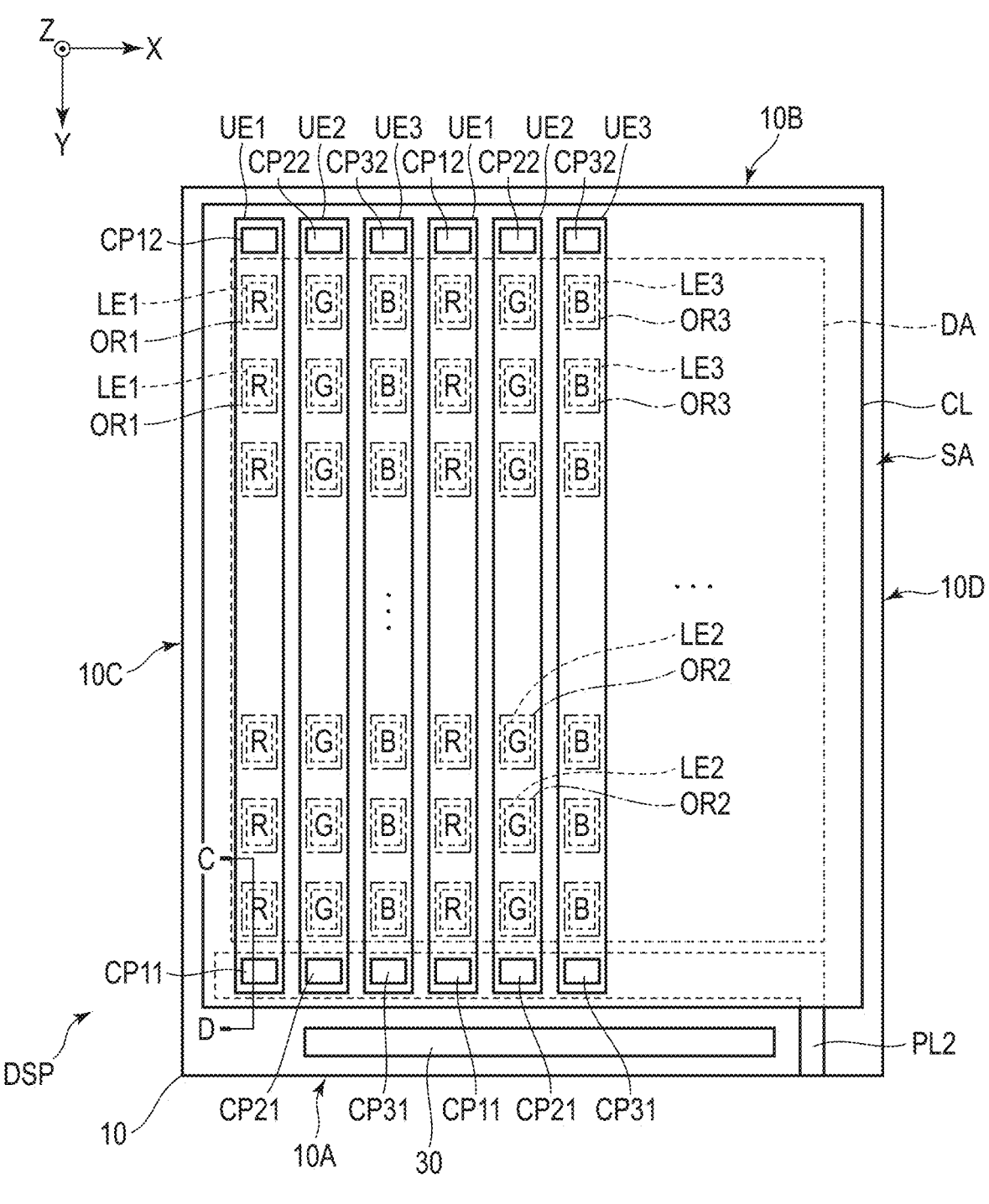
F I G. 4

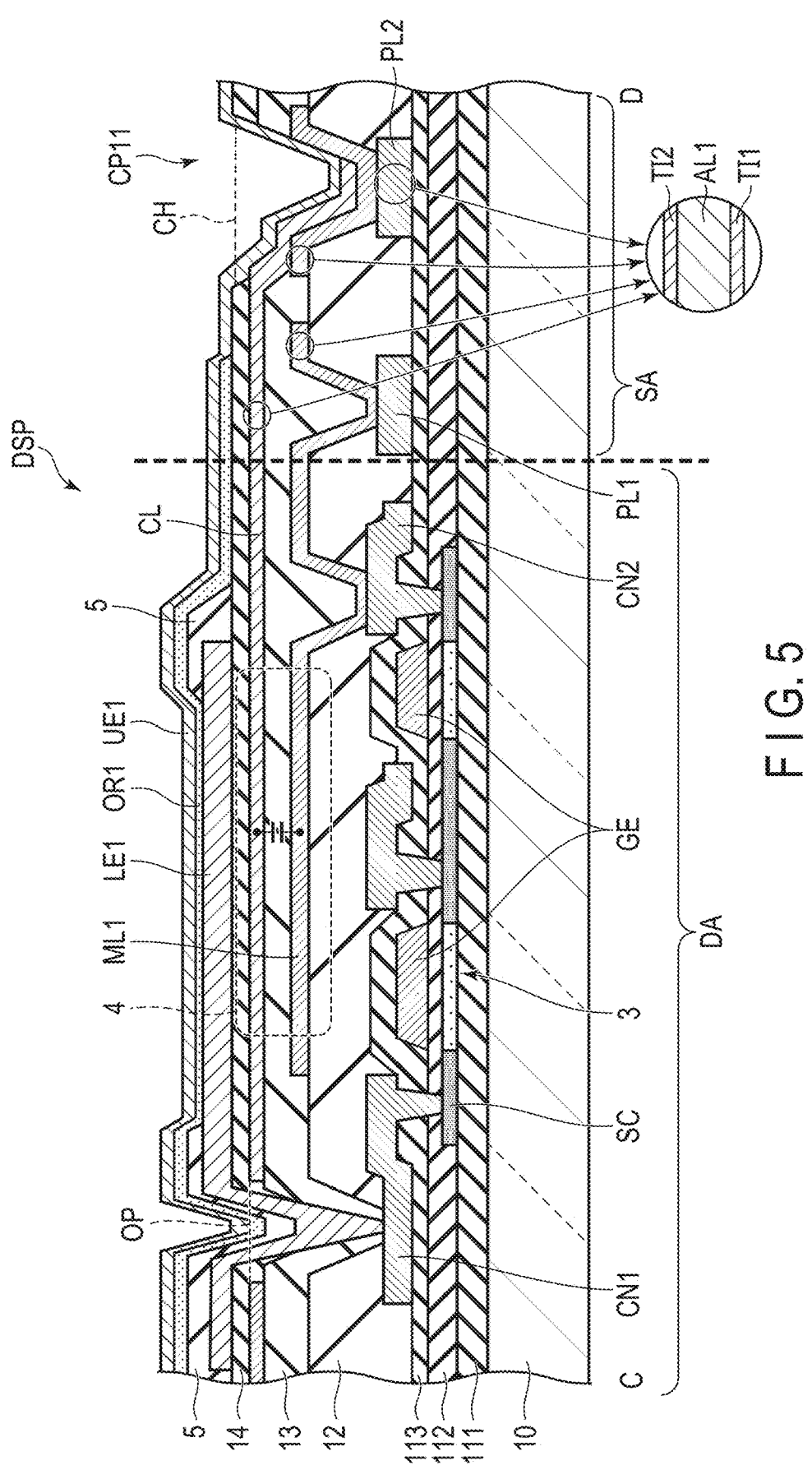
F I G. 5

DISPLAY DEVICE

CROSS-REFERENCE TO RELATED APPLICATIONS

This application is based upon and claims the benefit of priority from Japanese Patent Application No. 2022-124038, filed Aug. 3, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability has been required.

BRIEF DESCRIPTION OF THE DRAWINGS

FIG. 1 is a diagram showing a configuration example of a display device DSP.

FIG. 3 is a schematic cross-sectional view of the display device DSP along the A-B line of FIG. 2.

FIG. 4 is a plan view showing a configuration example of the main part of the display device DSP.

FIG. 5 is a schematic cross-sectional view of the display device DSP along the C-D line of FIG. 4.

DETAILED DESCRIPTION

Figure 2:
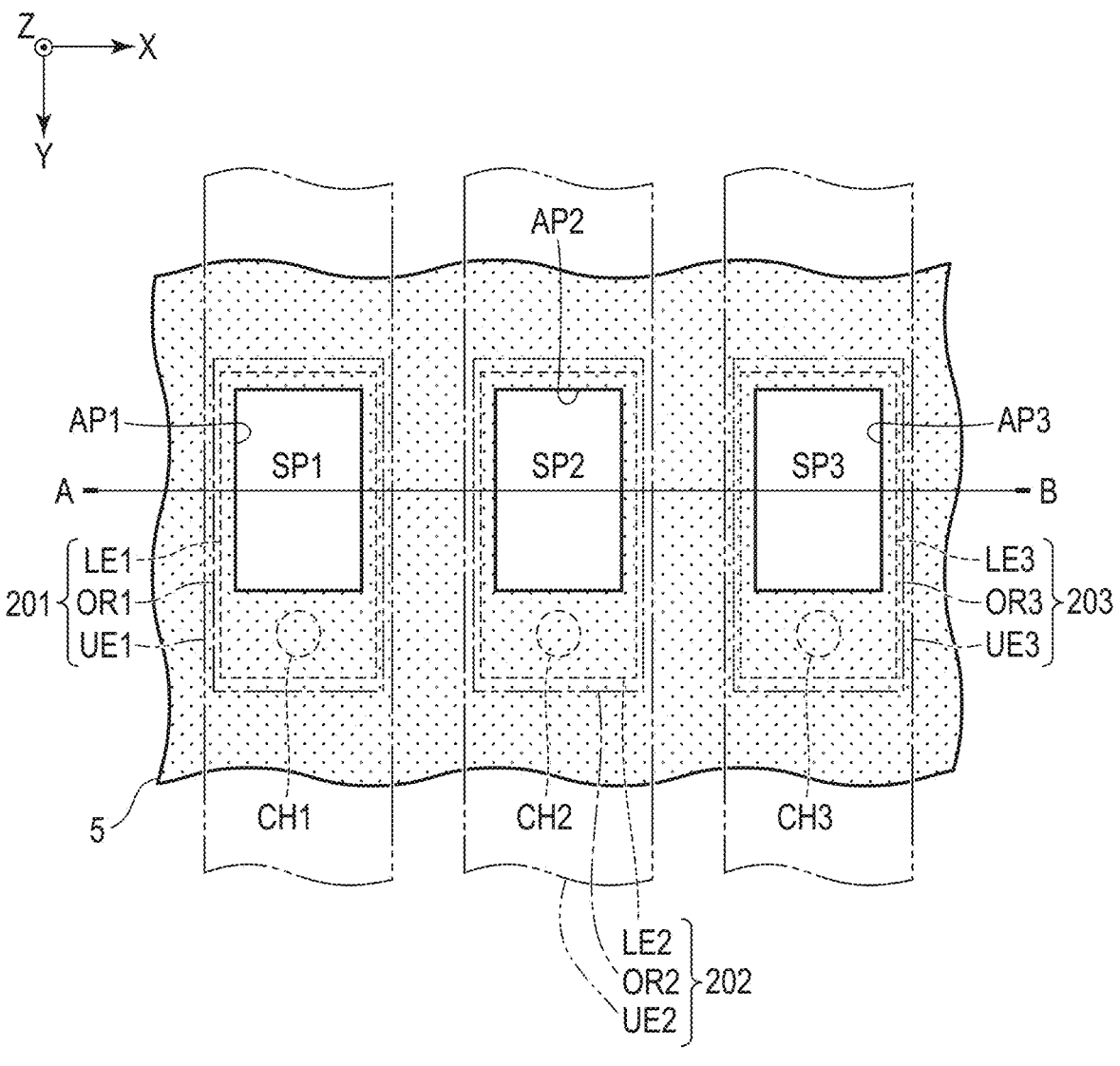
FIG. 2 is a diagram showing an example of the layout of subpixels SP1, SP2 and SP3.

Embodiments described herein aim to provide a display device which can prevent the reduction in reliability.

In general, according to one embodiment, a display device comprises a substrate, a conductive layer provided over a display area and extending to outside of the display area above the substrate, a plurality of lower electrodes provided in matrix in the display area above the conductive layer, a rib formed of an inorganic insulating material and comprising a plurality of apertures overlapping the lower electrodes, respectively, an organic layer provided on the lower electrodes in the apertures, and an upper electrode which is provided on the organic layer, is formed in a belt-like shape and is in contact with the conductive layer in both end portions located outside the display area.

According to another embodiment, a display device comprises a substrate, a conductive layer provided over a display area and extending to outside of the display area above the substrate, a plurality of lower electrodes provided in matrix in the display area above the conductive layer, a rib formed of an inorganic insulating material and comprising a plurality of apertures overlapping the lower electrodes, respectively, an organic layer provided on the lower electrodes in the apertures, and an upper electrode which is provided on the organic layer, is formed in a belt-like shape and is in contact with the conductive layer in both end portions located outside the display area. The rib is formed of silicon oxynitride.

According to yet another embodiment, a display device comprises a substrate, an organic insulating layer provided above the substrate, a metal layer provided on the organic insulating layer, a first inorganic insulating layer provided on the metal layer, a conductive layer provided over a display area and extending to outside of the display area, on the first inorganic insulating layer, a second inorganic insulating layer provided on the conductive layer, a plurality of lower electrodes provided in matrix in the display area, on the second inorganic insulating layer, a rib formed of an inorganic insulating material and comprising a plurality of apertures overlapping the lower electrodes, respectively, an organic layer provided on the lower electrodes in the apertures, an upper electrode which is provided on the organic layer, is formed in a belt-like shape and is in contact with the conductive layer in both end portions located outside the display area, a cap layer provided on the upper electrode and formed in a belt-like shape extending substantially parallel to the upper electrode, and a sealing layer formed of an inorganic insulating material, covering the upper electrode and the cap layer and formed in a belt-like shape extending substantially parallel to the upper electrode.

The embodiments can provide a display device which can prevent the reduction in reliability.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various elements are viewed parallel to the third direction Z, the appearance is defined as a plan view. The positive direction of the Z-axis is referred to as "on", "above" and the like. When terms indicating the positional relationships of two or more structural elements, such as "on", "above" and "face", are used, the target structural elements may be directly in contact with each other or may be spaced apart from each other as a gap or another structural element is interposed between them.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA outside the display area DA on an insulating substrate 10.

The substrate 10 may be glass or a resinous film having flexibility. The substrate 10 comprises a pair of sides 10A and 10B along a first direction X, and a pair of sides 10C and 10D along a second direction Y. A driver IC chip 30 which is a signal source is mounted in the surrounding area SA along the side 10A.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of subpixels SP arrayed in matrix in the first direction X and the second direction Y. Subpixels SP which exhibit different colors constitute a pixel PX. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3. It should be noted that subpixels SP may consist of two colors or may consist of structural elements which exhibit four or more colors.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. For example, the scanning line GL extends in the first direction X in the display area DA. One of the source electrode and the drain electrode of the pixel switch 2 is connected to a signal line SL. The other one is connected to the gate electrode of the drive transistor 3. For example, the signal line SL extends in the second direction Y in the display area DA. In the drive transistor 3, one of the source electrode and the drain electrode is connected to a high potential voltage power line PL1 (vdd), and the other one is connected to the anode of the display element 20 and the capacitor 4. The cathode of the display element 20 is connected to a low potential voltage power line PL2 (vss). At least part of various lines connected to the pixel circuit 1 is electrically connected to the driver IC chip 30.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

FIG. 2 is a diagram showing an example of the layout of subpixels SP1, SP2 and SP3.

In the example shown in FIG. 2, subpixel SP1, subpixel SP2 and subpixel SP3 are arranged in the first direction X. It should be noted that the layout of subpixels SP1, SP2 and SP3 is not limited to the example of FIG. 2.

A rib 5 is provided in the display area DA. The rib 5 comprises apertures AP1, AP2 and AP3 in subpixels SP1, SP2 and SP3, respectively.

Subpixels SP1, SP2 and SP3 comprise display elements 201, 202 and 203, respectively, as the display elements 20.

The display element 201 of subpixel SP1 comprises a lower electrode LE1, an upper electrode UE1 and an organic layer OR1 overlapping the aperture AP1. The display element 202 of subpixel SP2 comprises a lower electrode LE2, an upper electrode UE2 and an organic layer OR2 overlapping the aperture AP2. The display element 203 of subpixel SP3 comprises a lower electrode LE3, an upper electrode UE3 and an organic layer OR3 overlapping the aperture AP3.

Here, the outer shapes of the lower electrodes LE1, LE2 and LE3 are shown by dotted lines. The outer shapes of the organic layers OR1, OR2 and OR3 are shown by one-dot chain lines. The outer shapes of the upper electrodes UE1, UE2 and UE3 are shown by two-dot chain lines. The peripheral portion of each of the lower electrodes LE1, LE2 and LE3 overlaps the rib 5. It should be noted that the outer shape of each of the lower electrodes, organic layers and upper electrodes shown in the figure does not necessarily reflect the accurate shape.

The lower electrodes LE1, LE2 and LE3 correspond to, for example, the anodes of the display elements. The lower electrodes LE1, LE2 and LE3 are arranged at intervals in the first direction X. The organic layers OR1, OR2 and OR3 are arranged at intervals in the first direction X. The upper electrodes UE1, UE2 and UE3 correspond to the cathodes of the display elements or a common electrode. The upper electrodes UE1, UE2 and UE3 are arranged at intervals in the first direction X and extend in the second direction Y.

The lower electrode LE1 is connected to the drive transistor 3 of the pixel circuit 1 of subpixel SP1 (see FIG. 1) through a contact hole CH1. The lower electrode LE2 is connected to the drive transistor 3 of the pixel circuit 1 of subpixel SP2 through a contact hole CH2. The lower electrode LE3 is connected to the drive transistor 3 of the pixel circuit 1 of subpixel SP3 through a contact hole CH3.

In the example of FIG. 2, the areas of the apertures AP1, AP2 and AP3 are substantially equal to each other. It should be noted that the areas of the apertures AP1, AP2 and AP3 may be different from each other. For example, the area of the aperture AP2 may be greater than that of the aperture AP1. The area of the aperture AP3 may be greater than that of the aperture AP2.

For example, the display element 201 of subpixel SP1 is configured to emit light in a red wavelength range. The display element 202 of subpixel SP2 is configured to emit light in a green wavelength range. The display element 203 of subpixel SP3 is configured to emit light in a blue wavelength range.

FIG. 3 is a schematic cross-sectional view of the display device DSP along the A-B line of FIG. 2.

The display elements 201, 202 and 203 are provided above the substrate 10. A circuit layer 11 is provided on the substrate 10. The circuit layer 11 includes various circuits such as the pixel circuit 1, and various lines such as scanning line GL, signal line SL, high potential voltage power line PL1 and low potential voltage power line PL2 shown in FIG. 1. The circuit layer 11 is covered with an insulating layer 12. The insulating layer 12 functions as a planarization film which planarizes the irregularities formed by the circuit layer 11.

Metal layers ML1, ML2 and ML3 are provided on the insulating layer 12 and are arranged at intervals in the first direction X. The metal layer ML1 is located immediately under the display element 201. The metal layer ML2 is located immediately under the display element 202. The metal layer ML3 is located immediately under the display element 203. By each of these metal layers ML1, ML2 and ML3, the high potential voltage power line PL1 is electrically connected to the drive transistor 3. The metal layers ML1, ML2 and ML3 are covered with an insulating layer 13.

A conductive layer CL is provided on the insulating layer 13. The conductive layer CL is shaped like a single plate and is provided so as to be common to a plurality of display elements 201, 202 and 203. The conductive layer CL faces the metal layers ML1, ML2 and ML3 via the insulating layer 13. The conductive layer CL is electrically connected to the low potential voltage power line PL2. The conductive layer CL is covered with an insulating layer 14.

The lower electrodes LE1, LE2 and LE3 are provided on the insulating layer 14. The lower electrodes LE1, LE2 and LE3 face the conductive layer CL via the insulating layer 14. The rib 5 is provided on the insulating layer 14 and the lower electrodes LE1, LE2 and LE3. The end portions of the lower electrodes LE1, LE2 and LE3 are covered with the rib 5. In other words, the end portions of the lower electrodes LE1, LE2 and LE3 are provided between the insulating layer 14 and the rib 5. Of the lower electrodes LE1, LE2 and LE3, between the lower electrodes which are adjacent to each other, the insulating layer 14 is covered with the rib 5.

The organic layer OR1 is in contact with the lower electrode LE1 through the aperture AP1, covers the lower electrode LE1 and overlaps part of the rib 5. The upper electrode UE1 faces the lower electrode LE1, is provided on the organic layer OR1 and covers the organic layer OR1.

The organic layer OR2 is in contact with the lower electrode LE2 through the aperture AP2, covers the lower electrode LE2 and overlaps part of the rib 5. The upper electrode UE2 faces the lower electrode LE2, is provided on the organic layer OR2 and covers the organic layer OR2.

The organic layer OR3 is in contact with the lower electrode LE3 through the aperture AP3, covers the lower electrode LE3 and overlaps part of the rib 5. The upper electrode UE3 faces the lower electrode LE3, is provided on the organic layer OR3 and covers the organic layer OR3.

In the example shown in the figure, subpixels SP1, SP2 and SP3 include cap layers (optical adjustment layers) CA1, CA2 and CA3 for adjusting the optical property of the light emitted from the light emitting layers of the organic layers OR1, OR2 and OR3.

The cap layer CA1 is located in the aperture AP1 and is provided on the upper electrode UE1. The cap layer CA2 is located in the aperture AP2 and is provided on the upper electrode UE2. The cap layer CA3 is located in the aperture AP3 and is provided on the upper electrode UE3.

Sealing layers SE1, SE2 and SE3 are provided in subpixels SP1, SP2 and SP3, respectively.

The sealing layer SE1 covers the cap layer CA1 and the upper electrode UE1. The sealing layer SE2 covers the cap layer CA2 and the upper electrode UE2. The sealing layer SE3 covers the cap layer CA3 and the upper electrode UE3. The sealing layers SE1, SE2 and SE3 are arranged at intervals in the first direction X.

The sealing layers SE1, SE2 and SE3 are covered with a protective layer 15.

The insulating layer 12 is an organic insulating layer.

The insulating layer 13, the insulating layer 14, the rib 5 and the sealing layers SE1, SE2 and SE3 are inorganic insulating layers.

The insulating layers 13 and 14 are formed of silicon nitride (SiNx) as an example of inorganic insulating materials. The insulating layer 13 corresponds to a first inorganic insulating layer. The insulating layer 14 corresponds to a second inorganic insulating layer.

The rib 5 is formed of silicon nitride (SiNx) as an example of inorganic insulating materials. It should be noted that the rib 5 may be formed of, as another inorganic insulating material, a single-layer body of one of silicon oxide (SiOx), silicon oxynitride (SiON) and aluminum oxide ($Al_2O_3$). The rib 5 may be formed as a stacked layer body of a combination consisting of at least two of a silicon nitride layer, a silicon oxide layer, a silicon oxynitride layer and an aluminum oxide layer.

The thickness of the rib 5 is sufficiently less than that of the insulating layer 12. For example, the thickness of the rib 5 is greater than or equal to 200 nm but less than or equal to 400 nm. The sealing layers SE1, SE2 and SE3 are formed of the same inorganic insulating material.

The sealing layers SE1, SE2 and SE3 are formed of silicon nitride (SiNx) as an example of inorganic insulating materials. It should be noted that each of the sealing layers SE1, SE2 and SE3 may be formed of, as another inorganic insulating material, a single-layer body of one of silicon oxide (SiOx), silicon oxynitride (SiON) and aluminum oxide ($Al_2O_3$). Each of the sealing layers SE1, SE2 and SE3 may be formed of a stacked layer body of a combination consisting of at least two of a silicon nitride layer, a silicon oxide layer, a silicon oxynitride layer and an aluminum oxide layer. Thus, the sealing layers SE1, SE2 and SE3 may be formed of the same material as the rib 5.

The thickness of the sealing layer SE1, the thickness of the sealing layer SE2 and the thickness of the sealing layer SE3 are substantially equal to each other and are, for example, approximately 1 μm.

The protective layer 15 is formed of a multilayer body consisting of transparent thin films. For example, as the thin films, the multilayer body includes a thin film formed of an inorganic material and a thin film formed of an organic material.

Each of the lower electrodes LE1, LE2 and LE3 may be formed of a transparent conductive material such as ITO or may comprise a multilayer structure of a metal material such as silver (Ag) and a transparent conductive material. Each of the upper electrodes UE1, UE2 and UE3 is formed of, for example, a metal material such as an alloy of magnesium and silver (MgAg). Each of the upper electrodes UE1, UE2 and UE3 may be formed of a transparent conductive material such as ITO.

Each of the organic layers OR1, OR2 and OR3 includes a plurality of functional layers such as a hole injection layer, a hole transport layer, an electron blocking layer, a hole blocking layer, an electron transport layer and an electron injection layer. The organic layer OR1 includes a light emitting layer EM1. The organic layer OR2 includes a light emitting layer EM2. The light emitting layer EM2 is formed of a material different from that of the light emitting layer EM1. The organic layer OR3 includes a light emitting layer EM3. The light emitting layer EM3 is formed of a material different from the materials of the light emitting layers EM1 and EM2.

The material of the light emitting layer EM1, the material of the light emitting layer EM2 and the material of the light emitting layer EM3 are materials which emit light in different wavelength ranges.

For example, the light emitting layer EM1 is formed of a material which emits light in a red wavelength range. The light emitting layer EM2 is formed of a material which emits light in a green wavelength range. The light emitting layer EM3 is formed of a material which emits light in a blue wavelength range.

Each of the cap layers CA1, CA2 and CA3 is formed of, for example, a multilayer body consisting of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CA1, CA2 and CA3 may be omitted.

In these display elements 201, 202 and 203, common voltage is applied to the upper electrodes UE1, UE2 and UE3, respectively. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the organic layer OR1 emits light in a red wavelength range. When a potential difference is formed between the lower electrode LE2 and the upper electrode UE2, the light emitting layer EM2 of the organic layer OR2 emits light in a green wavelength range. When a potential difference is formed between the lower electrode LE3 and the upper electrode UE3, the light emitting layer EM3 of the organic layer OR3 emits light in a blue wavelength range.

FIG. 4 is a plan view showing a configuration example of the main part of the display device DSP.

Above the substrate 10, the conductive layer CL is provided in substantially the entire display area DA, and further extends to the surrounding area SA outside the display area DA. The conductive layer CL is electrically connected to the low potential voltage power line PL2 located between the side 10A of the substrate 10 and the display area DA in connection portions CP11, CP21 and CP31.

The lower electrodes LE1, LE2 and LE3 are located above the conductive layer CL, and are provided in matrix in the first direction X and the second direction Y in the display area DA. A column in which a plurality of lower electrodes LE1 are arranged, a column in which a plurality of lower electrodes LE2 are arranged and a column in which a plurality of lower electrodes LE3 are arranged, are arranged in the first direction X.

A plurality of lower electrodes LE1 are arranged in line at intervals in the second direction Y. The organic layer OR1 is shaped like a plurality of islands. The organic layers OR1 are provided on the lower electrodes LE1, respectively, and are arranged in line at intervals in the second direction Y.

The upper electrode UE1 is formed in a belt-like shape extending in the second direction Y and is provided so as to correspond to the line in which a plurality of lower electrodes LE1 are arranged. In other words, the upper electrode UE1 is provided on the organic layer OR1 in the display area DA. The upper electrode UE1 extends to the surrounding area SA beyond the display area DA.

Of the upper electrode UE1, the end portion which extends between the side 10A of the substrate 10 and the display area DA is in contact with the conductive layer CL in the connection portion CP11, and is electrically connected to the conductive layer CL. Of the upper electrode UE1, the end portion which extends between the side 10B of the substrate 10 and the display area DA is in contact with the conductive layer CL in a connection portion CP12, and is electrically connected to the conductive layer CL.

A plurality of lower electrodes LE2 are arranged in line at intervals in the second direction Y. The organic layer OR2 is shaped like a plurality of islands. The organic layers OR2 are provided on the lower electrodes LE2, respectively, and are arranged in line at intervals in the second direction Y.

The upper electrode UE2 is formed in a belt-like shape extending in the second direction Y and is provided so as to correspond to the line in which a plurality of lower electrodes LE2 are arranged. In other words, the upper electrode UE2 is provided on the organic layer OR2 in the display area DA. The upper electrode UE2 extends to the surrounding area SA beyond the display area DA.

Of the upper electrode UE2, the end portion which extends between the side 10A of the substrate 10 and the display area DA is in contact with the conductive layer CL in the connection portion CP21, and is electrically connected to the conductive layer CL. Of the upper electrode UE2, the end portion which extends between the side 10B of the substrate 10 and the display area DA is in contact with the conductive layer CL in a connection portion CP22, and is electrically connected to the conductive layer CL.

A plurality of lower electrodes LE3 are arranged in line at intervals in the second direction Y. The organic layer OR3 is shaped like a plurality of islands. The organic layers OR3 are provided on the lower electrodes LE3, respectively, and are arranged in line at intervals in the second direction Y.

The upper electrode UE3 is formed in a belt-like shape extending in the second direction Y and is provided so as to correspond to the line in which a plurality of lower electrodes LE3 are arranged. In other words, the upper electrode UE3 is provided on the organic layer OR3 in the display area DA. The upper electrode UE3 extends to the surrounding area SA beyond the display area DA.

Of the upper electrode UE3, the end portion which extends between the side 10A of the substrate 10 and the display area DA is in contact with the conductive layer CL in the connection portion CP31, and is electrically connected to the conductive layer CL. Of the upper electrode UE3, the end portion which extends between the side 10B of the substrate 10 and the display area DA is in contact with the conductive layer CL in a connection portion CP32, and is electrically connected to the conductive layer CL.

For example, the width of each of the upper electrodes UE1, UE2 and UE3 in the first direction X is 3 to 10 μm in a specification which requires a definition of 1000 ppi or greater.

FIG. 5 is a schematic cross-sectional view of the display device DSP along the C-D line of FIG. 4. In FIG. 5, the illustrations of the cap layer, the sealing layer and the protective layer are omitted.

The circuit layer 11 shown in FIG. 3 comprises an insulating layer 111, an insulating layer 112, an insulating layer 113, the drive transistor 3, the high potential voltage power line PL1, the low potential voltage power line PL2 and the like. The insulating layer 111, the insulating layer 112 and the insulating layer 113 are inorganic insulating layers.

The drive transistor 3 is provided on at least the insulating layer 111, and is covered with the insulating layer 12. The drive transistor 3 comprises a semiconductor layer SC, a gate electrode GE and connection electrodes CN1 and CN2.

The semiconductor layer SC is provided on the insulating layer 111 and is covered with the insulating layer 112. The gate electrode GE is provided on the insulating layer 112 and is covered with the insulating layer 113. The connection electrodes CN1 and CN2 are provided on the insulating layer 113 and are covered with the insulating layer 12.

The high resistive area of the semiconductor layer SC overlaps the gate electrode GE. The low resistive area of the semiconductor layer SC is connected to the connection electrodes CN1 and CN2. By the connection electrode CN1, the semiconductor layer SC is electrically connected to the lower electrode LE1. By the connection electrode CN2, the semiconductor layer SC is electrically connected to the metal layer ML1.

The high potential voltage power line PL1 and the low potential voltage power line PL2 are provided on the insulating layer 113 and are covered with the insulating layer 12. The high potential voltage power line PL1 and the low potential voltage power line PL2 are formed of the same material as the connection electrodes CN1 and CN2, and are for example, as shown in the enlarged view of the figure, a stacked layer body in which an aluminum layer AL1 is located between a pair of titanium layers TI1 and TI2.

The metal layer ML1 and the connection electrode CN are provided on the insulating layer 12 and are covered with the insulating layer 13. By the metal layer ML1, the drive transistor 3 is electrically connected to the high potential voltage power line PL1. The connection electrode CN is in contact with the low potential voltage power line PL2 in the connection portion CP11. The metal layer ML1 and the connection electrode CN are formed of the same material, and are, for example, as shown in the enlarged view of the figure, a stacked layer body in which an aluminum layer AL1 is located between a pair of titanium layers TI1 and TI2.

The conductive layer CL is provided on the insulating layer 13 and is covered with the insulating layer 14. The conductive layer CL is in contact with the connection electrode CN in the connection portion CP11 of the surrounding area SA. In other words, by the connection electrode CN, the conductive layer CL is electrically connected to the low potential voltage power line PL2.

The conductive layer CL comprises an opening OP for allowing the electrical connection between the lower electrode LE1 and the drive transistor 3 in the display area DA. The conductive layer CL faces the metal layer ML1 via the insulating layer 13 in the display area DA and constitutes the capacitor 4. For example, as shown in the enlarged view of the figure, the conductive layer CL is a stacked layer body in which an aluminum layer AL1 is located between a pair of titanium layers TI1 and TI2.

The lower electrode LE1 is provided on the insulating layer 14 and faces the conductive layer CL via the insulating layer 14. These lower electrode LE1 and conductive layer CL can also constitute the capacitor 4. The lower electrode LE1 is, for example, a stacked layer body in which a reflecting electrode (Ag) is located between a pair of transparent electrodes (ITO).

The upper electrode UE1 extends over the display area DA and the surrounding area SA, and is in contact with the conductive layer CL in a contact hole CH formed in the insulating layer 14 in the connection portion CP11. By this configuration, the upper electrode UE1 is electrically connected to the conductive layer CL and is electrically connected to the low potential voltage power line PL2. The upper electrode UE1 is formed of, for example, an alloy of magnesium and silver.

As described above, the conductive layer CL provided in substantially the entire display area DA is formed of a stacked layer body of a metal material. The resistance of the conductive layer CL is lower than that of a conductive layer formed of a transparent oxide. The generation of potential gradient in the plane of the conductive layer CL is prevented. Each of the upper electrodes UE1, UE2 and UE3 is formed in a belt-like shape, and is connected to the conductive layer CL in the both end portions extending to the surrounding area SA outside the display area DA. Thus, regarding each of the upper electrodes UE1, UE2 and UE3, the difference in resistance between the vicinity of the side 10A of the substrate 10 and the vicinity of the side 10B of the substrate 10 is reduced. In other words, a desired voltage can be applied to each of the upper electrodes UE1, UE2 and UE3. Thus, in the subpixels SP of the entire display area DA, a desired display performance can be realized, and the reduction in reliability is prevented.

Further, it is unnecessary to provide a power supply portion comprising a complicated structure between the side 10B of the substrate 10 and the display area DA. Thus, the width of the frame between the side 10B and the display area DA can be reduced.

Further, it is unnecessary to lay a power supply line between the side 10C of the substrate 10 and the display area DA or between the side 10D of the substrate 10 and the display area DA. Thus, the width of the frame between the side 10C and the display area DA and the width of the frame between the side 10D and the display area DA can be reduced.

Figure 6:
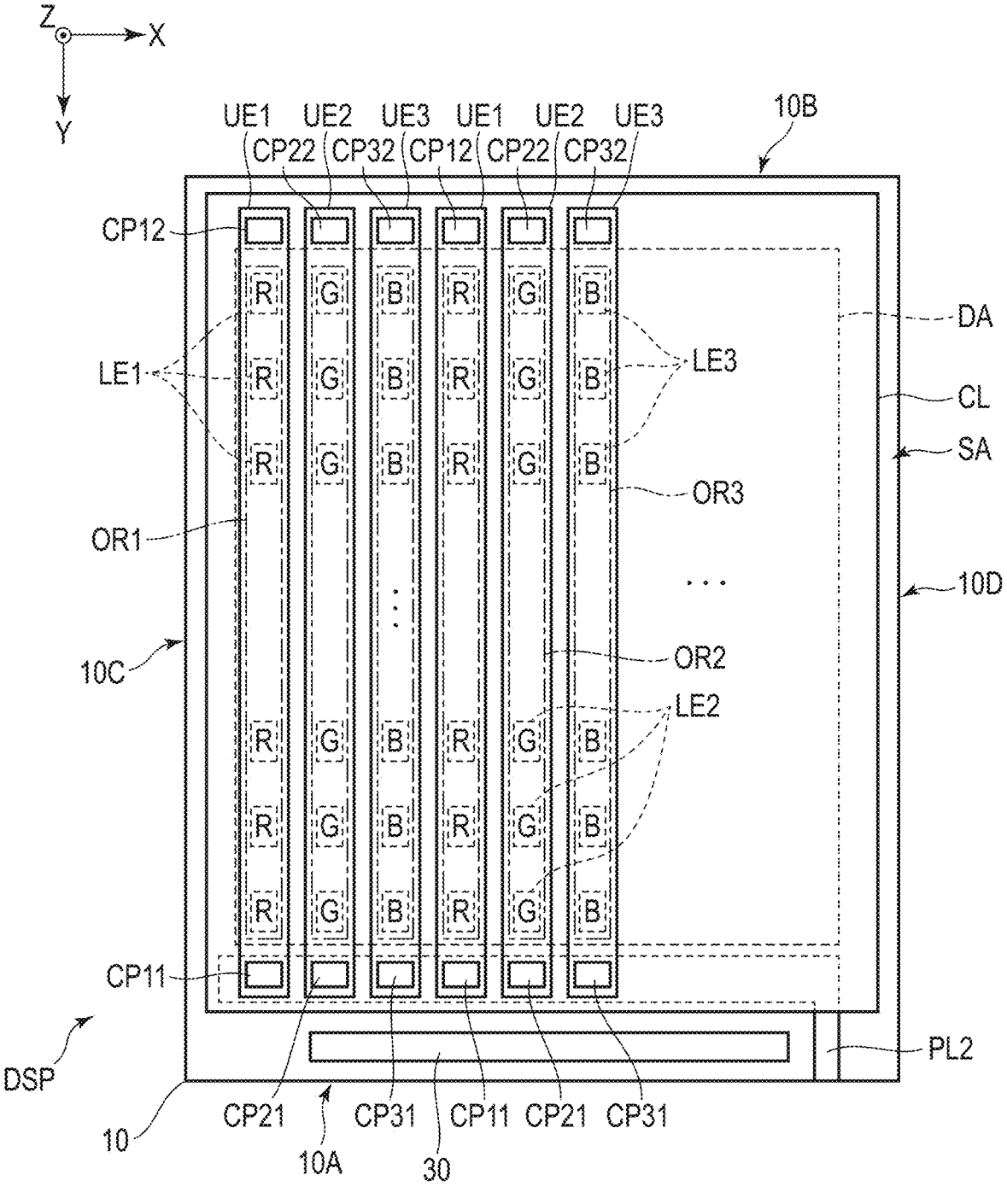
FIG. 6 is a plan view showing another configuration example of the main part of the display device DSP.

FIG. 6 is a plan view showing another configuration example of the main part of the display device DSP.

The configuration example shown in FIG. 6 is different from the configuration example shown in FIG. 4 in respect that each of the organic layers OR1, OR2 and OR3 is formed in a belt-like shape. Here, the structures explained with reference to FIG. 4 are denoted by the same reference numbers, detailed description thereof being omitted unless necessary.

The conductive layer CL is provided in substantially the entire display area DA, and further extends to the surrounding area SA outside the display area DA. The conductive layer CL is electrically connected to the low potential voltage power line PL2 located between the side 10A of the substrate 10 and the display area DA in the connection portions CP11, CP21 and CP31.

A plurality of lower electrodes LE1 are arranged in line at intervals in the second direction Y. The upper electrode UE1 is formed in a belt-like shape extending in the second direction Y and is provided so as to correspond to the line in which a plurality of lower electrodes LE1 are arranged. The organic layer OR1 is formed in a belt-like shape extending in the second direction Y, extends substantially parallel to the upper electrode UE1 and is provided on the lower electrodes LE1. The upper electrode UE1 is provided on the organic layer OR1 in the display area DA, and extends to the surrounding area SA beyond the display area DA.

Of the upper electrode UE1, the end portion which extends between the side 10A of the substrate 10 and the display area DA is in contact with the conductive layer CL in the connection portion CP11. Of the upper electrode UE1, the end portion which extends between the side 10B of the substrate 10 and the display area DA is in contact with the conductive layer CL in the connection portion CP12.

A plurality of lower electrodes LE2 are arranged in line at intervals in the second direction Y. The upper electrode UE2 is formed in a belt-like shape extending in the second direction Y and is provided so as to correspond to the line in which a plurality of lower electrodes LE2 are arranged. The organic layer OR2 is formed in a belt-like shape extending in the second direction Y, extends substantially parallel to the upper electrode UE2 and is provided on the lower electrodes LE2. The upper electrode UE2 is provided on the organic layer OR2 in the display area DA, and extends to the surrounding area SA beyond the display area DA.

Of the upper electrode UE2, the end portion which extends between the side 10A of the substrate 10 and the display area DA is in contact with the conductive layer CL in the connection portion CP21. Of the upper electrode UE2, the end portion which extends between the side 10B of the substrate 10 and the display area DA is in contact with the conductive layer CL in the connection portion CP22.

A plurality of lower electrodes LE3 are arranged in line at intervals in the second direction Y. The upper electrode UE3 is formed in a belt-like shape extending in the second direction Y and is provided so as to correspond to the line in which a plurality of lower electrodes LE3 are arranged. The organic layer OR3 is formed in a belt-like shape extending in the second direction Y, extends substantially parallel to the upper electrode UE3 and is provided on the lower electrodes LE3. The upper electrode UE3 is provided on the organic layer OR3 in the display area DA, and extends to the surrounding area SA beyond the display area DA.

Of the upper electrode UE3, the end portion which extends between the side 10A of the substrate 10 and the display area DA is in contact with the conductive layer CL in the connection portion CP31. Of the upper electrode UE3, the end portion which extends between the side 10B of the substrate 10 and the display area DA is in contact with the conductive layer CL in the connection portion CP32.

In this configuration example, effects similar to those of the above description can be obtained.

Figure 7:
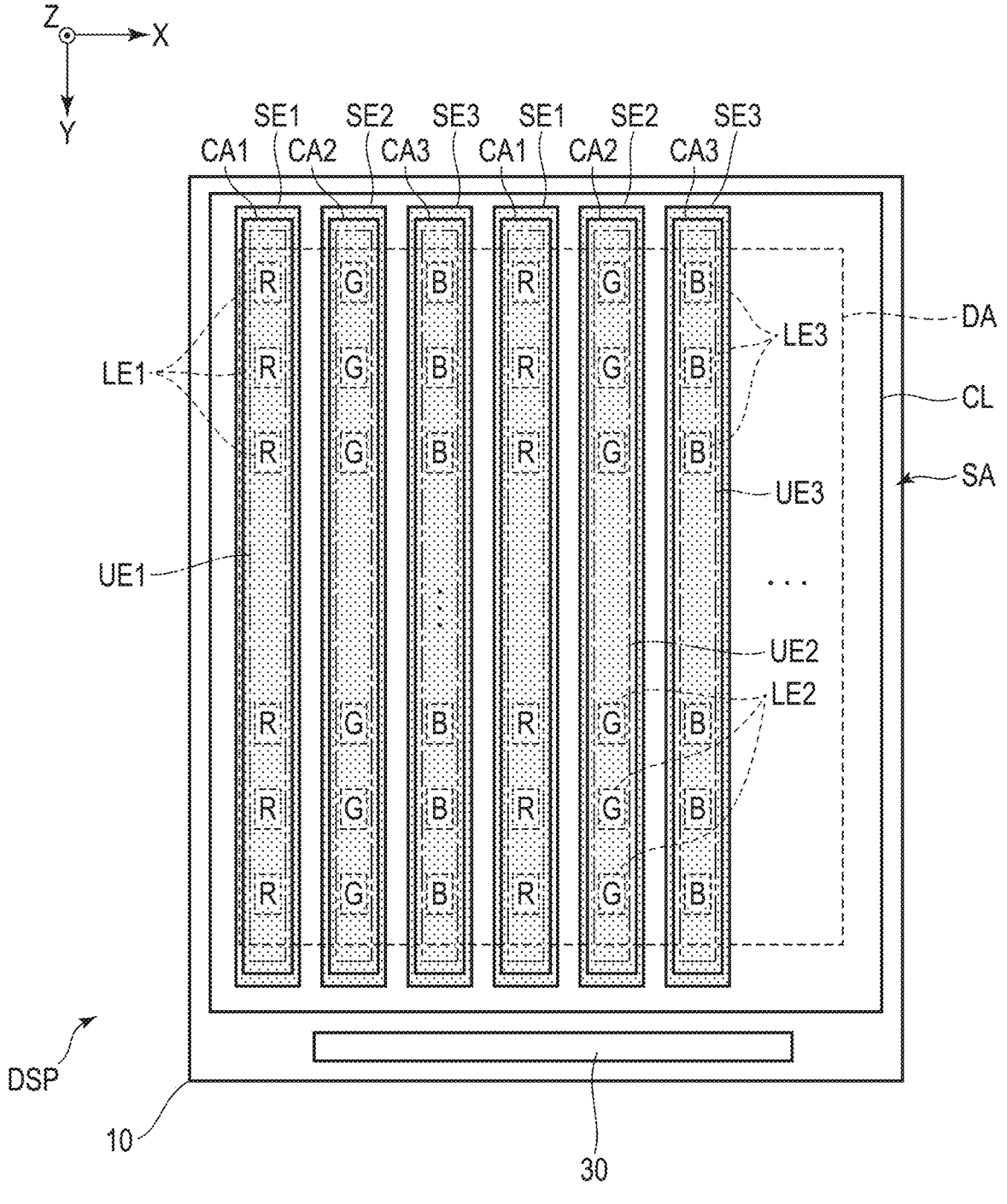
FIG. 7 is a plan view showing another configuration example of the main part of the display device DSP.

FIG. 7 is a plan view showing another configuration example of the main part of the display device DSP. Here, the illustrations of the organic layers, etc., are omitted.

Each of the cap layer CA1 and sealing layer SE1 shown in FIG. 7 extends in the second direction Y as seen in plan view. In other words, the cap layer CA1 is provided on the upper electrode UE1 and is formed in a belt-like shape extending substantially parallel to the upper electrode UE1. The sealing layer SE1 covers the upper electrode UE1 and the cap layer CA1 and is formed in a belt-like shape extending substantially parallel to the upper electrode UE1.

The cap layer CA2 is provided on the upper electrode UE2 and is formed in a belt-like shape extending substantially parallel to the upper electrode UE2. The sealing layer SE2 covers the upper electrode UE2 and the cap layer CA2 and is formed in a belt-like shape extending substantially parallel to the upper electrode UE2.

The cap layer CA3 is provided on the upper electrode UE3 and is formed in a belt-like shape extending substantially parallel to the upper electrode UE3. The sealing layer SE3 covers the upper electrode UE3 and the cap layer CA3 and is formed in a belt-like shape extending substantially parallel to the upper electrode UE3.

These cap layers CA1, CA2 and CA3 and sealing layers SE1, SE2 and SE3 having the above shapes can be applied when the organic layers OR1, OR2 and OR3 are shaped like a plurality of islands as shown in FIG. 4, and can be also applied when the organic layers OR1, OR2 and OR3 are formed in a belt-like shape as shown in FIG. 6.

Each of the sealing layers SE1, SE2 and SE3 is formed of an inorganic insulating material such as silicon nitride. They are spaced apart from each other. This configuration can prevent moisture penetration through the sealing layers SE1, SE2 and SE3, thereby preventing the corrosion of the lower electrodes and upper electrodes and the degradation of the organic layers which are omitted in the figure.

As explained above, the present embodiment can provide a display device which can prevent the reduction in reliability.

All of the display devices that can be implemented by a person of ordinary skill in the art through arbitrary design changes to the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:
a substrate;
a conductive layer provided over a display area and extending to outside of the display area above the substrate;
a plurality of lower electrodes provided in matrix in the display area above the conductive layer;
a rib formed of an inorganic insulating material and comprising a plurality of apertures overlapping the lower electrodes, respectively;
an organic layer provided on the lower electrodes in the apertures; and
an upper electrode which is provided on the organic layer, is formed in a belt-like shape and is in contact with the conductive layer in both end portions located outside the display area.

2. The display device of claim 1, further comprising:
a drive transistor provided above the substrate and electrically connected to one of the lower electrodes;
an organic insulating layer covering the drive transistor;
a metal layer provided on the organic insulating layer to electrically connect the drive transistor and a high potential voltage power line to each other;
a connection electrode provided on the organic insulating layer to electrically connect the conductive layer and a low potential voltage power line to each other;
a first inorganic insulating layer interposed between the metal layer and the conductive layer; and
a second inorganic insulating layer interposed between the conductive layer and the lower electrodes, wherein
the upper electrode is in contact with the conductive layer in a contact hole formed in the second inorganic insulating layer.

3. The display device of claim 2, wherein
each of the conductive layer, the metal layer and the connection electrode is a stacked layer body in which an aluminum layer is located between a pair of titanium layers.

4. The display device of claim 2, wherein
each of the rib, the first inorganic insulating layer and the second inorganic insulating layer is formed of silicon nitride.

5. The display device of claim 1, wherein
the organic layer is shaped like a plurality of islands, and
is provided on each of the lower electrodes.

6. The display device of claim 1, wherein
the organic layer is formed in a belt-like shape extending
substantially parallel to the upper electrode and is
provided on the lower electrodes.

7. The display device of claim 1, further comprising:
a cap layer provided on the upper electrode and formed in
a belt-like shape extending substantially parallel to the
upper electrode; and
a sealing layer formed of an inorganic insulating material,
covering the upper electrode and the cap layer and
formed in a belt-like shape extending substantially
parallel to the upper electrode.

8. The display device of claim 7, wherein
the sealing layer is formed of silicon nitride.

9. A display device comprising:
a substrate;
a conductive layer provided over a display area and
extending to outside of the display area above the
substrate;
a plurality of lower electrodes provided in matrix in the
display area above the conductive layer;
a rib formed of an inorganic insulating material and
comprising a plurality of apertures overlapping the
lower electrodes, respectively;
an organic layer provided on the lower electrodes in the
apertures; and
an upper electrode which is provided on the organic layer,
is formed in a belt-like shape and is in contact with the
conductive layer in both end portions located outside
the display area, wherein
the rib is formed of silicon oxynitride.

10. The display device of claim 9, further comprising:
a drive transistor provided above the substrate and elec-
trically connected to one of the lower electrodes;
an organic insulating layer covering the drive transistor;
a metal layer provided on the organic insulating layer to
electrically connect the drive transistor and a high
potential voltage power line to each other;
a connection electrode provided on the organic insulating
layer to electrically connect the conductive layer and a
low potential voltage power line to each other;
a first inorganic insulating layer interposed between the
metal layer and the conductive layer; and
a second inorganic insulating layer interposed between
the conductive layer and the lower electrodes, wherein
the upper electrode is in contact with the conductive layer
in a contact hole formed in the second inorganic
insulating layer.

11. The display device of claim 10, wherein
each of the conductive layer, the metal layer and the
connection electrode is a stacked layer body in which
an aluminum layer is located between a pair of titanium
layers.

12. The display device of claim 11, wherein
each of the first inorganic insulating layer and the second
inorganic insulating layer is formed of silicon nitride.

13. The display device of claim 12, wherein
the organic layer is shaped like a plurality of islands, and
is provided on each of the lower electrodes.

14. The display device of claim 13, wherein
the organic layer is formed in a belt-like shape extending
substantially parallel to the upper electrode and is
provided on the lower electrodes.

15. The display device of claim 12, further comprising:
a cap layer provided on the upper electrode and formed in
a belt-like shape extending substantially parallel to the
upper electrode; and
a sealing layer formed of an inorganic insulating material,
covering the upper electrode and the cap layer and
formed in a belt-like shape extending substantially
parallel to the upper electrode.

16. The display device of claim 15, wherein
the sealing layer is formed of silicon nitride.

17. A display device comprising:
a substrate;
an organic insulating layer provided above the substrate;
a metal layer provided on the organic insulating layer;
a first inorganic insulating layer provided on the metal
layer;
a conductive layer provided over a display area and
extending to outside of the display area, on the first
inorganic insulating layer;
a second inorganic insulating layer provided on the con-
ductive layer;
a plurality of lower electrodes provided in matrix in the
display area, on the second inorganic insulating layer;
a rib formed of an inorganic insulating material and
comprising a plurality of apertures overlapping the
lower electrodes, respectively;
an organic layer provided on the lower electrodes in the
apertures;
an upper electrode which is provided on the organic layer,
is formed in a belt-like shape and is in contact with the
conductive layer in both end portions located outside
the display area;
a cap layer provided on the upper electrode and formed in
a belt-like shape extending substantially parallel to the
upper electrode; and
a sealing layer formed of an inorganic insulating material,
covering the upper electrode and the cap layer and
formed in a belt-like shape extending substantially
parallel to the upper electrode.

18. The display device of claim 17, wherein
the upper electrode is in contact with the conductive layer
in a contact hole formed in the second inorganic
insulating layer.

19. The display device of claim 18, wherein
each of the conductive layer and the metal layer is a
stacked layer body in which an aluminum layer is
located between a pair of titanium layers.

20. The display device of claim 19, wherein
each of the first inorganic insulating layer and the second
inorganic insulating layer is formed of silicon nitride.

21. The display device of claim 20, wherein
the organic layer is shaped like a plurality of islands, and
is provided on each of the lower electrodes.

22. The display device of claim 21, wherein
the organic layer is formed in a belt-like shape extending
substantially parallel to the upper electrode and is
provided on the lower electrodes.

* * * * *